United States Patent [19]
Miyamoto et al.

[11] Patent Number: 5,287,306
[45] Date of Patent: Feb. 15, 1994

[54] SEMICONDUCTOR MEMORY DEVICE

[75] Inventors: Shinji Miyamoto; Shigeo Ohshima, both of Yokohama, Japan

[73] Assignee: Kabushiki Kaisha Toshiba, Kawasaki, Japan

[21] Appl. No.: 718,449

[22] Filed: Jun. 20, 1991

[30] Foreign Application Priority Data

Jun. 22, 1990 [JP] Japan ................................ 2-164677

[51] Int. Cl.$^5$ .............................................. G11C 7/00
[52] U.S. Cl. .................... 365/189.05; 365/189.09; 365/226
[58] Field of Search ............... 365/189.09, 226, 189.05

[56] References Cited

U.S. PATENT DOCUMENTS

| | | | |
|---|---|---|---|
| 4,661,928 | 4/1987 | Yasuoka | 365/189 |
| 5,073,872 | 12/1991 | Masuda et al. | 365/189.05 |
| 5,136,542 | 8/1992 | Abe et al. | 365/189.05 |

FOREIGN PATENT DOCUMENTS 0350879 1/1990 European Pat. Off. .

OTHER PUBLICATIONS

Wada et al., "A 34-ns 1-Mbit CMOS SRAM", IEEE Journal of Solid-State Circuits, vol. SC-22, No. 5, Oct. 1987, New York, U.S. pp. 727-732.

*Primary Examiner*—James B. Mullins
*Attorney, Agent, or Firm*—Foley & Lardner

[57] ABSTRACT

A semiconductor memory device includes a first power source having a non-ground potential $V_{cc1}$ terminal and a ground potential $V_{ss1}$ terminal. The internal circuit is supplied with power from the first power source. The first power source is dedicated to the internal circuit. The internal circuit selects a memory cell of a memory cell array in accordance with an inputted address. The internal circuit has a first output terminal and a second output terminal the first output terminal outputs one of a pair of potential $V_{cc1}$ and $V_{ss1}$ and the second output terminal outputs the other of the pair in accordance with the data in the selected memory cell. A second power source has a non-ground potential $V_{cc2}$ terminal and a ground potential $V_{ss2}$ terminal. The output circuit is supplied with power from the second power source which is dedicated to the output circuit. The output circuit has first and second transistors serially connected between the $V_{cc2}$ terminal and $V_{ss2}$. The control terminals of the first and second transistors are connected to the first and second output terminals. A third transistor is connected between an interconnection between the first and second transistors connected to a data output from which data is externally outputted and the first output terminal, and the control terminal of the third transistor being connected to the second output terminal.

18 Claims, 4 Drawing Sheets

SEMICONDUCTOR MEMORY DEVICE

FIELD OF THE INVENTION

The present invention relates to a semiconductor memory device, and more particularly to a semiconductor memory device capable of suppressing noises generated when data is outputted, the semiconductor memory device having an internal circuit including a memory cell array and the like and an output circuit for outputting data read from the internal circuit, and the internal circuit and the output circuit each having an independent power source.

BACKGROUND OF THE INVENTION

Developments of semiconductor memory devices have been generally concentrated on chip miniaturization, high speed, high integration, and the like, resulting in the recent advent of high performance products. The higher the performance of products is, the more seriously the developments should be carried out while considering possible noises. Specifically, for example, if a large peak current is used to speed up the operation, a quick change in current will generate power source noises. As a means for suppressing such noises, there is widely used a method of supplying power to an internal circuit and an output circuit independently from different power sources. Power source noises do not always generate regularly. For example, in a multi-port memory, each port operates asynchronously, so that power source noises are generated at an irregular period. A device which generates irregular noises due to asynchronous circuit operation produces sometimes an erroneous data output because it happens that noises are superposed one upon another. Accordingly, it is not sufficient for a multi-port memory or the like to provide independent power sources, requiring another means for suppressing noises.

An erroneous operation caused by a superposition of noises will be described taking as an example a semiconductor memory device having two independent power sources and operating asynchronously such as in the case of a multi-port memory.

FIG. 1 shows such a conventional semiconductor memory device wherein the data output circuit in particular is shown in detail and one of a plurality of ports is shown. In FIG. 1, a memory cell array 4 of an internal circuit 10 has a plurality of memory cells disposed in a matrix. In this array 4, a row address A1 and column address A2 are decoded by decoders 5 to select a particular memory cell. Complementary data D and $\bar{D}$ of the selected memory cell is applied to an output control circuit 3 which operates to read data from the memory cell array 4. The output control circuit 3 may take various circuit arrangements one example of which is shown in FIG. 2. In this circuit, data D and $\bar{D}$ is inputted to two AND gates I and II, and an enable signal is applied to an enable terminal ENBL. This output control circuit 3 has first and second output nodes. The first node 1 is connected to the gate of an N-channel transistor T1 of an output circuit 20, and the second node 2 is connected to the gate of another N-channel transistor T0. The interconnection between the transistors T1 and T0 is used as a data output terminal $D_{out}$. Power is supplied to the semiconductor memory cell array 4 and output control circuit 3 from a power source P1 ($V_{cc1}$, $V_{ss1}$) dedicated to the internal circuit. Power is supplied to the transistors T1 and T0 from another power source P2 ($V_{cc2}$, $V_{ss2}$) dedicated to the output circuit 20 different from the power source P1 dedicated to the internal circuit. Other ports are constructed having similar internal circuits 10 and output circuits 20.

With the circuit arrangement described above, data stored in the memory cell array 4 is read from the output control circuit 3. The read-out data controls the gates of the transistors T1 and T0 via the first and second nodes 1 and 2, and is outputted from the data output terminal $D_{out}$.

Consider now that an output from the data output terminal $D_{out}$ fully swings from "1" to "0". If an output at the data output terminal $D_{out}$ is "1", the first node 1 has the power source voltage $V_{cc1}$, and the second node 2 has the ground potential $V_{ss1}$. Therefore, the transistor T1 turns on and the transistor T0 turns off. If the output at the data output terminal $D_{out}$ is to be changed to "0", the levels at the nodes 1 and 2 of the output control circuit 3 are exchanged. Namely, the first node 1 has the ground potential $V_{ss1}$, and the second node 2 has the power source voltage $V_{cc1}$. As a result, the transistor T1 turns off and at the same time the transistor T0 turns on to output "0" from the data output terminal $D_{out}$.

There will be described with reference to the equivalent circuit shown in FIG. 3 the potential change of the ground potentials $V_{ss1}$ and $V_{ss2}$ when the transistor T0 turns on and the level at the data output terminal $D_{out}$ changes from "1" to "0".

As seen from FIG. 3, the internal circuit 10 has a pad Pad 1 for the ground potential $V_{ss1}$. The output circuit 20 has a pad Pad 2 for the ground potential $V_{ss2}$. It can be considered that a resistance R of wirings or the like is present between the pad Pad 2 and the transistor T0. Between the pad Pad 2 and the external absolute ground, there is present an inductance L of inner leads, wirings, or the like. An external load 30 is connected to the output circuit 20. This external load 30 can be considered as having a large capacitance such as 100 pF. Therefore, this capacitance CL is charged sufficiently as shown in FIG. 3. Thereafter, as the transistor T1 turns off and the transistor T0 turns on to change the level at the data output terminal $D_{out}$ to "0", a discharge circuit DC is formed as indicated by a two-dot chain line shown in FIG. 3. The electric charge in the capacitor CL is discharged via the discharge circuit DC. However, as described above, the discharge circuit DC includes the resistor R and inductor L so that the capacitor repeats charge/discharge operations in alternate directions. That is, the potential at the data output terminal $D_{out}$ oscillates as shown in FIG. 4(a). Apart from the above, the device shown in FIG. 1 is constructed as a multi-port memory wherein the ports shown in FIG. 1 and other ports not shown operate asynchronously, i.e., independently. It is assumed that a sense amplifier of the internal circuit 10 operates for the ports not shown, and that considerable power source noises are generated. In such a case, as shown in FIG. 4(b), the ground potential $V_{ss1}$ of the power source P1 dedicated to the internal circuit will rise. If this rise of the ground potential $V_{ss1}$ and the fall of the level at the data output terminal $D_{out}$ described above take a phase relationship as shown in FIG. 4(b), a large potential difference will be generated between a pair of ground potentials $V_{ss1}$ and $V_{ss2}$. The influence of this potential difference causes the potential $V_{ss2}$ at the data output terminal $D_{out}$ to further rise as it oscillates in the manner described above. As a result, an output which should be "0" does not become "0" and is considered as "1", leading to an error of a low level output voltage $V_{OL}$.

SUMMARY OF THE INVENTION

The present invention has been made in consideration of the above circumstances. It is an object of the present invention to provide a semiconductor memory device having independent power sources for the internal circuit and output circuit, capable of providing an effective means for eliminating noises.

According to one aspect of the present invention, there is provided a semiconductor memory device comprising:

a power source dedicated to an internal circuit and having a non-ground potential $V_{cc1}$ terminal and a ground potential $V_{ss1}$ terminal:

the internal circuit being supplied with power from the power source dedicated to the internal circuit, the internal circuit selecting a memory cell of a memory cell array in accordance with an inputted address and having a first output terminal and a second output terminal, and the first output terminal outputting one of the pair of potentials $V_{cc1}$ and $V_{ss1}$ and the second output terminal outputting the other of the pair, in accordance with the data in the selected memory cell;

a power source dedicated to an output circuit and having a non-ground potential $V_{cc2}$ terminal and a ground potential $V_{ss2}$ terminal; and the output circuit being supplied with power from the power source dedicated to the output circuit, the output circuit having first and second switching means serially connected between the $V_{cc2}$ terminal and $V_{ss2}$ terminal, the control terminals of the first and second switching means being connected to the first and second output terminals, third switching means being connected between an interconnection between the first and second switching means connected to a data output terminal from which data is externally outputted, and the first output terminal, and the control terminal of the third switching means being connected to the second output terminal.

DESCRIPTION OF THE PREFERRED EMBODIMENTS

Preferred embodiments of the present invention will be described with reference to the accompanying drawings.

Figure 5:
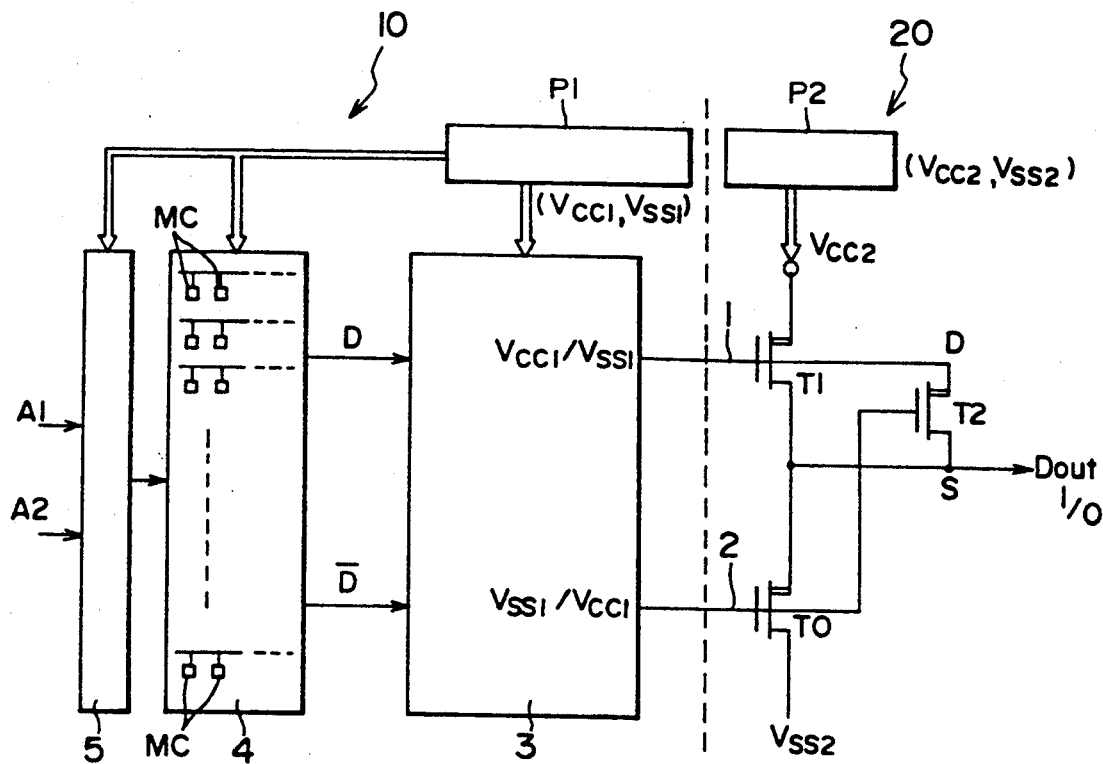
FIG. 5 is a circuit diagram showing a semiconductor memory device according to an embodiment of the present invention.

FIG. 5 shows a semiconductor memory device according to an embodiment of the present invention, wherein a data output circuit portion in particular is shown in detail. In FIG. 5, like elements to those shown in FIG. 1 are represented by using identical reference numerals.

Figure 1:
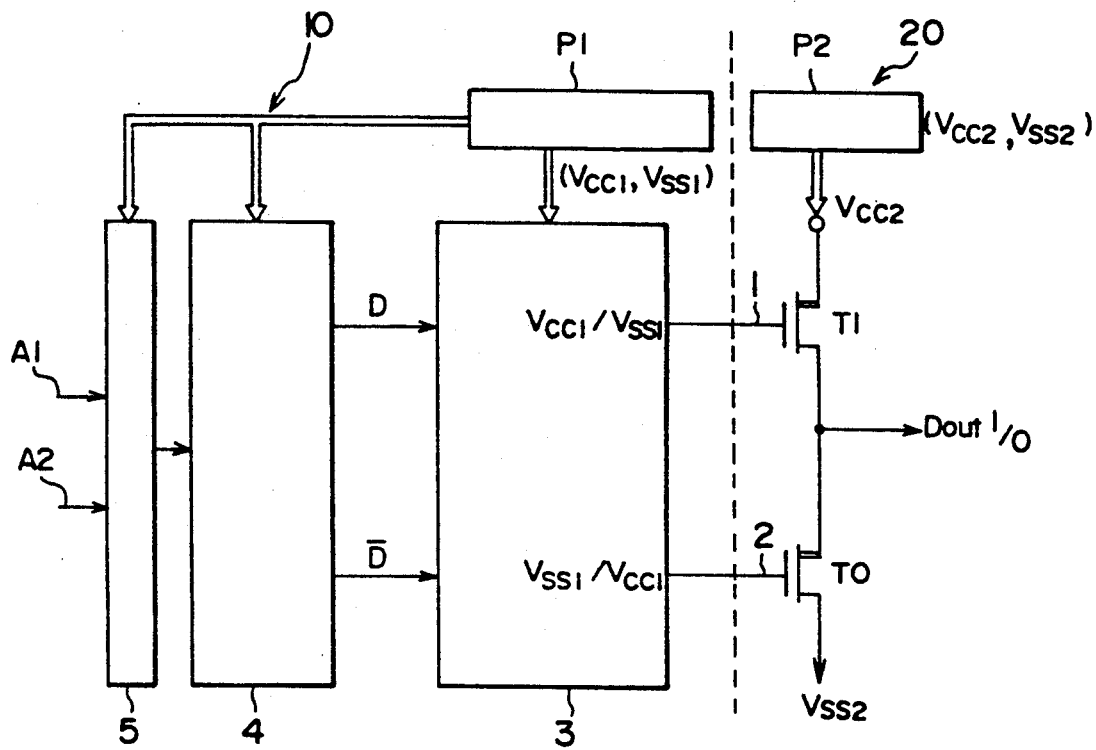
FIG. 1 is a circuit diagram showing a conventional semiconductor memory device.

The different points of the device shown in FIG. 5 from that shown in FIG. 1 are as follows. One end (source) of an N-channel transistor T2 is connected to the data output terminal $D_{out}$. The other end (drain) of the transistor T2 is connected to the first node 1 of the output control circuit 3. The gate thereof is connected to the second node 2 of the output control circuit 3. In FIG. 5, MC represents a memory cell.

Figure 2:
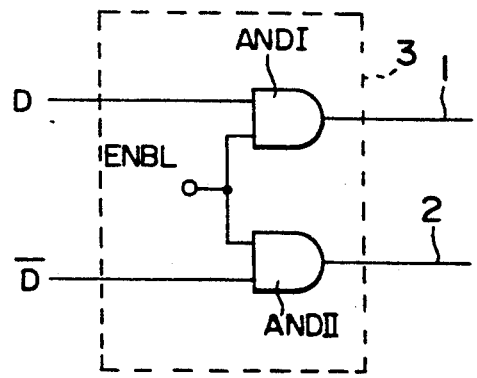
FIG. 2 is a detailed circuit diagram showing a part of the circuit of FIG. 1.
Figure 3:
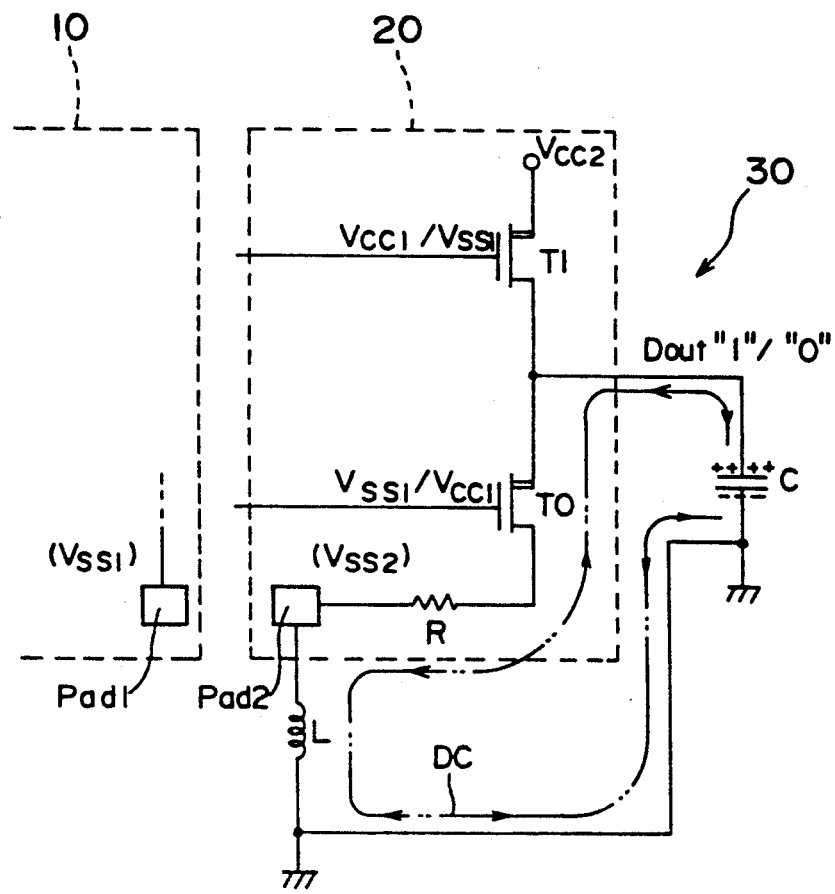
FIG. 3 is an equivalent circuit of the circuit shown in FIG. 1.

The memory cell array 4, output control circuit 3, and associated circuits are powered with a power source P1 dedicated to the internal circuit. The transistors T0, T1, and T2 are powered with another power source P2 dedicated to the output circuit. The output control circuit 3 has the circuit arrangement, e.g., same as that shown in FIG. 2.

With the circuit arrangement as above, data stored in the memory cell array 4 is read via the output control circuit 3. The read-out data controls the gates of the transistors T1 and T0 to output the data from the data output terminal $D_{out}$.

Figure 4:
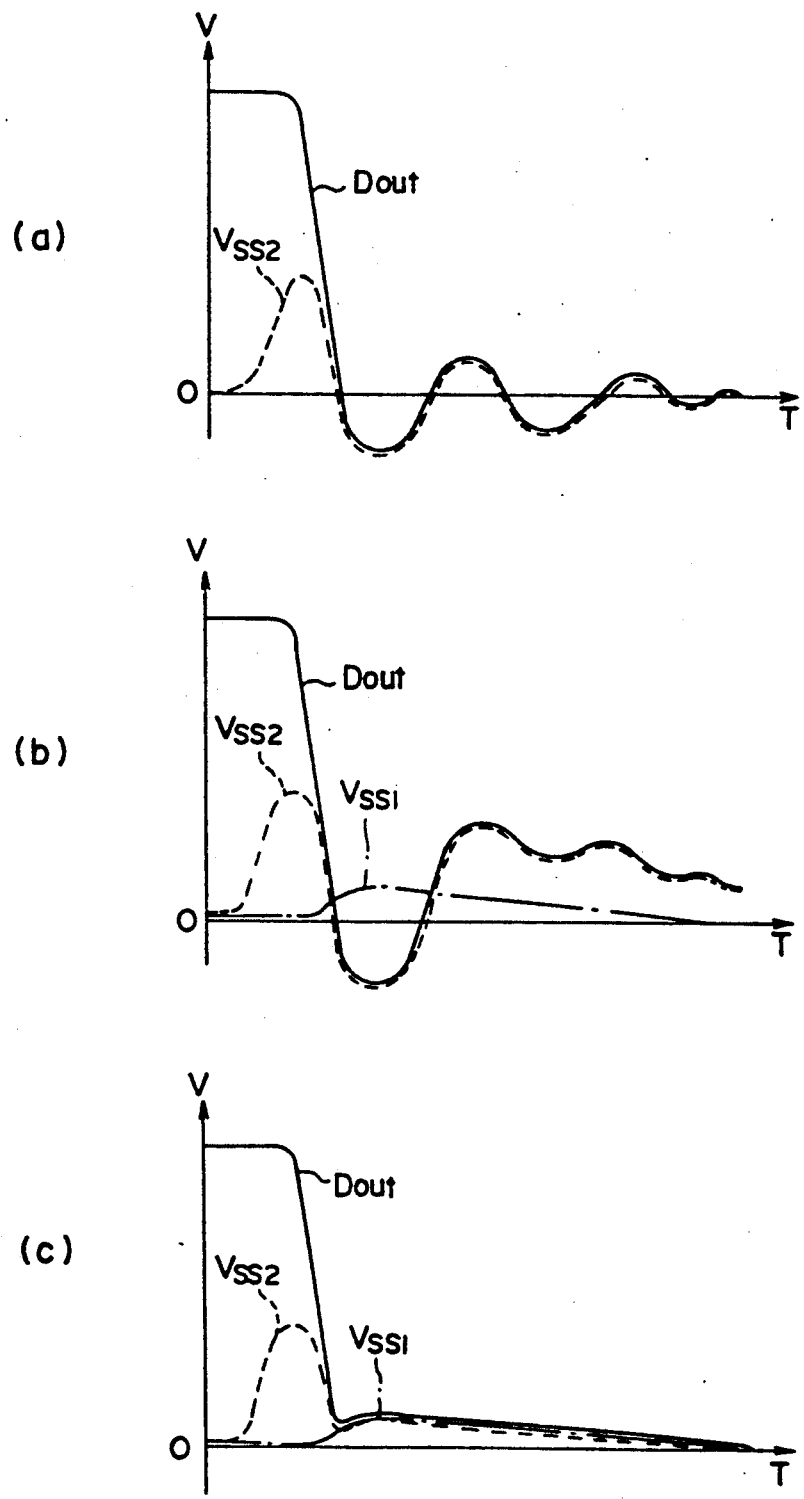
FIG. 4 shows waveforms used for explaining the circuit shown in FIGS. 1 and 5.

Consider now that an output from the data output terminal $D_{out}$ fully swings from "1" to "0". When the output at the data output $D_{out}$ takes "1", the first node 1 has the power source voltage $V_{cc1}$, and the second node 1 has the ground potential $V_{ss1}$. As a result, the transistor T1 turns on and the transistor T0 turns off. If the output at the data output terminal $D_{out}$ is to be changed to "0" from this state, the output control circuit 3 operates to make the first node 1 have the ground potential $V_{ss1}$ and the second node 2 have the power source voltage $V_{cc1}$. Therefore, the transistor T1 turns off and at the same time the transistor T0 turns on, outputting "0" from the output terminal $D_{out}$. At the same time the transistor T2 turns on. The first node 1 of the output control circuit 3 therefore takes the same potential as at the data output terminal $D_{out}$. Namely, as the transistor T2 turns on, the data output terminal $D_{out}$ is made to have the same potential as the ground potential $V_{ss1}$ of the power source P1 dedicated to the internal circuit. It is assumed that noises at the ground potential $V_{ss1}$ of the power source P1 dedicated to the internal circuit generate as shown in FIG. 4(c) when "0" is outputted from the data output terminal $D_{out}$. Even if the noises are in synchronism with noises at the power source P2 dedicated to the output circuit, data can be correctly read because the transistor T2 is turned on. Namely, since the transistor T2 turns on, an oscillation of the potential at the data output terminal $D_{out}$ caused by the above-described charge/discharge operation can be made same as that shown in FIG. 4(a) (the case where there is no fluctuation of the ground potential $V_{ss1}$). In this manner, noises appearing at the data output terminal can be suppressed within an allowable range so that the data "0" itself can be correctly read.

Figure 6:
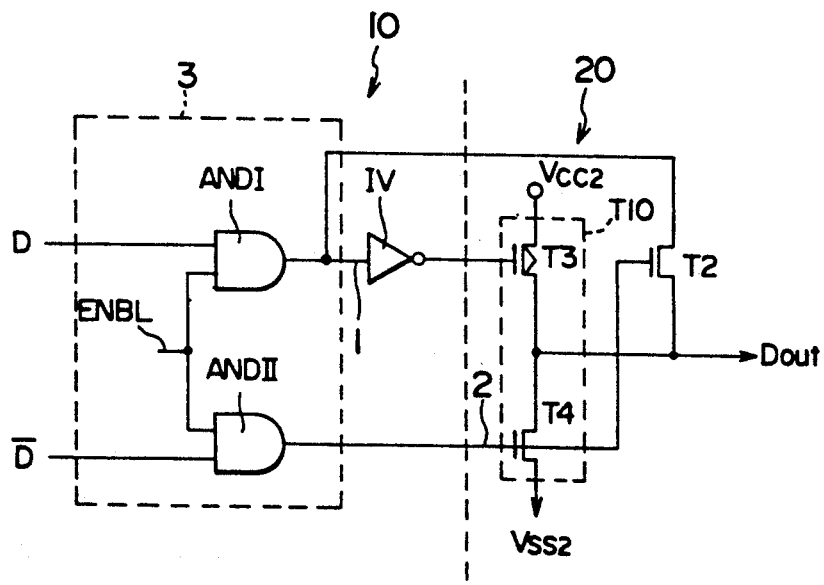
FIG. 6 is a circuit diagram showing another embodiment.

FIG. 6 shows the second embodiment of the present invention. In this embodiment, an output circuit 20 is provided with C-MOS transistors T10 including a P-channel transistor T3 and an N-channel transistor T4. An output of an AND gate I is applied via an inverter IV to the gate of the P-channel transistor T3.

As described above, according to the embodiments of the present invention, in a semiconductor chip having a plurality of ground power source terminals, the transistor T2 causes the ground potentials $V_{ss1}$ and $V_{ss2}$ of the plurality of power sources to take the same potential, when a data having the same level as the ground potential $V_{ss2}$ is outputted. Accordingly, output noises can be suppressed while improving the reliability of output data.

Specifically, according to the present invention, in a device having independent power sources respectively dedicated to supply power to an internal circuit such as a memory cell array and to an output circuit for externally outputting the data read from the memory cell, if a data output to the external takes a ground potential of the power source dedicated to the output circuit, the ground potentials of the two independent power sources are made equal. Therefore, even a data at the ground potential is to be outputted from the output circuit, the data can be correctly outputted without any influence of noises, thereby improving the reliability of the device.

What is claimed is:

1. A semiconductor memory device comprising:
    a first power source having a non-ground potential $V_{cc1}$ terminal and a ground potential $V_{ss1}$ terminal;
    an internal circuit being supplied with power from said first power source dedicated to said internal circuit, said internal circuit selecting a memory cell of a memory cell array in accordance with an inputted address and having a first output terminal and a second output terminal, and said first output terminal outputting one of said pair of potentials $V_{cc1}$ and $V_{ss1}$ and said second output terminal outputting the other of said pair, in accordance with the data in said selected memory cell;
    a second power source having a non-ground potential $V_{cc2}$ terminal and a ground potential $V_{ss2}$ terminal; and
    an output circuit being supplied with power from said second power source dedicated to said output circuit, said output circuit having first and second switching means serially connected between said $V_{cc2}$ terminal and $V_{ss2}$ terminal, the first and second switching means having first and second control terminals, the control terminals of said first and second switching means being connected to said first and second output terminals respectively, and having third switching means being connected between an interconnection between said first and second switching means connected to a data output terminal from which data is externally outputted, and said first output terminal, and a third control terminal of said third switching means being connected to said second output terminal.

2. A device according to claim 1, wherein said first and second switching means each are switching elements of the same conductivity type, and the first and second control terminals of said first and second switching means are directly connected to said first and second output terminals.

3. A device according to claim 2, wherein said first and second switching means each are N-channel transistors.

4. A device according to claim 3, wherein said third switching means is an N-channel transistor.

5. A device according to claim 1, wherein said internal circuit includes an output control circuit which has an input terminal for receiving a data from said selected memory cell and said first and second output terminals.

6. A device according to claim 5, wherein said output control circuit executes a logical operation between an enable signal and a data from said selected memory cell to output said data to said first and second output terminals.

7. A device according to claim 1, wherein said first and second switching means constitute C-MOS transistors, said first control terminal of said first switching means and said first output terminal connected together via an inverter, and said second control terminal of said second switching means is directly connected to said second output terminal.

8. A device according to claim 7, wherein said first and second switching means are P- and N-channel transistors.

9. A device according to claim 8, wherein said third switching means is an N-channel transistor.

10. A semiconductor memory device comprising:
    a first power source having a non-ground potential $V_{cc1}$ terminal and a ground potential $V_{ss1}$ terminal;
    an internal circuit being supplied with power from said first power source dedicated to said internal circuit, said internal circuit selecting a memory cell of a memory cell array in accordance with an inputted address and having a first output terminal and a second output terminal, and said first output terminal outputting one of said pair of potentials $V_{cc1}$ and $V_{ss1}$ and said second output terminal outputting the other of said pair, in accordance with the data in said selected memory cell;
    a second power source having a non-ground potential $V_{cc2}$ terminal and a ground potential $V_{ss2}$ terminal; and
    an output circuit being supplied with power from said second power source dedicated to said output circuit, said output circuit having first and second switching means serially connected between said $V_{cc2}$ terminal and $V_{ss2}$ terminal, the first and second switching means having first and second control terminals, the control terminals of said first and second switching means being connected to said first and second output terminals respectively, and having a third transistor being directly connected between an interconnection between said first and second switching means directly connected to a data output terminal from which data is externally outputted, and said first output terminal, and a third control terminal of the third transistor being connected to said second output terminal.

11. A device according to claim 10, wherein said first and second switching means each are switching elements of the same conductivity type, and the first and second control terminals of said first and second switching means are directly connected to said first and second output terminals.

12. A device according to claim 11, wherein said first and second switching means each are N-channel transistors.

13. A device according to claim 12, wherein said third transistor is an N-channel transistor.

14. A device according to claim 10, wherein said internal circuit includes an output control circuit which has an input terminal for receiving a data from said selected memory cell and said first and second output terminals.

15. A device according to claim 14, wherein said output control circuit executes a logical operation between an enable signal and a data from said selected memory cell to output said data to said first and second output terminals.

16. A device according to claim 10, wherein said first and second switching means constitutes C-MOS transistors, said first control terminal of said first switching means and said first output terminal are connected together via an inverter, and said second control terminal of said second switching means is directly connected to said second output terminal.

17. A device according to claim 16, wherein said first and second switching means are P- and N-channel transistors.

18. A device according to claim 17, wherein said third transistor is an N-channel transistor.

* * * * *